(12) United States Patent
Shako et al.

(10) Patent No.: US 7,443,923 B2
(45) Date of Patent: Oct. 28, 2008

(54) DISTORTION COMPENSATING APPARATUS AND METHOD

(75) Inventors: Hideharu Shako, Kawasaki (JP); Yasuhito Funyu, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 175 days.

(21) Appl. No.: 11/437,168

(22) Filed: May 19, 2006

(65) Prior Publication Data

US 2007/0200625 A1 Aug. 30, 2007

(30) Foreign Application Priority Data

Feb. 14, 2006 (JP) ............... 2006-036799

(51) Int. Cl.
*H04L 25/49* (2006.01)
(52) U.S. Cl. .................................. 375/296
(58) Field of Classification Search ......... 327/123–125, 327/149, 159, 16, 161; 375/295–297; 455/91, 455/114.2, 114.3; 332/106, 107, 117, 123, 332/149, 159
See application file for complete search history.

(56) References Cited

U.S. PATENT DOCUMENTS

| 5,404,378 | A  | * | 4/1995 | Kimura ..................... 375/296 |
| 6,864,745 | B2 | * | 3/2005 | Ode et al. .................. 330/149 |
| 7,102,969 | B2 | * | 9/2006 | Tsukamoto et al. ........ 369/47.5 |
| 7,106,133 | B2 | * | 9/2006 | Hamada et al. ............. 330/149 |
| 7,215,717 | B2 | * | 5/2007 | Doi ............................ 375/297 |
| 7,242,247 | B2 | * | 7/2007 | Hirose et al. ............... 330/149 |
| 2001/0007435 | A1 |   | 7/2001 | Ode et al. |
| 2003/0118125 | A1 |   | 6/2003 | Doi |
| 2004/0120420 | A1 |   | 6/2004 | Hongo et al. |
| 2005/0073361 | A1 |   | 4/2005 | Hamada et al. |
| 2005/0184803 | A1 | * | 8/2005 | Hirose et al. ............... 330/149 |
| 2006/0062324 | A1 | * | 3/2006 | Naito et al. ................. 375/296 |

FOREIGN PATENT DOCUMENTS

| JP | 10-327209 | 12/1998 |
| WO | WO 03/103166 | 12/2003 |

OTHER PUBLICATIONS

European Search Report dated Mar. 21, 2007.

* cited by examiner

*Primary Examiner*—Tesfaldet Bocure
(74) *Attorney, Agent, or Firm*—Katten Muchin Rosenman LLP

(57) ABSTRACT

The distortion compensating apparatus which adaptively updates a distortion compensation coefficient for an amplifier based on a difference between input and output signals of the amplifier, comprises: a distortion amount detector which detects the amount of distort of an output signal of the amplifier; a parameter holder which holds a parameter having been set therein; a parameter corrector which corrects the parameter in such a manner that the distortion amount detected by the detector is improved; and a distortion amount corrector which corrects the distortion amount detected by the detector in such a manner that the distortion amount is reduced by an offset amount according to a detection error. This arrangement makes it possible to accurately set the parameter relating to difference detection which is a factor of updating of distortion compensation coefficients of the distortion compensating apparatus.

13 Claims, 11 Drawing Sheets

PROCEED TO S33 OF FIG. 3

DISTORTION COMPENSATING APPARATUS AND METHOD

CROSS REFERENCE TO RELATED APPLICATIONS

This application is based on and hereby claims priority to Japanese Application No. 2006-36799 filed on Feb. 14, 2006 in Japan, the contents of which are hereby incorporated by reference.

BACKGROUND OF THE INVENTION (1) Field of the Invention

The present invention relates to a distortion compensating apparatus and a distortion compensating method. The invention relates particularly to an art suitable for use in a predistortion amplifier which compensates for nonlinearity of an amplifier by adaptively updating a distortion compensation coefficient for an input signal input to the amplifier based on a difference between input and output signals.

(2) Description of the Related Art

FIG. 7 is a block diagram showing a construction of an important part of a previous Digital Predistortion (DPD) amplifier. The DPD amplifier of FIG. 7 includes: a Lookup Table (LUT: a distortion compensation table) 110; an address generator 111; an LMS arithmetic operator (distortion compensation arithmetic operation unit) 112; a multiplier 113; an equalizer filter (complex filter) 114; a digital/analogue (D/A) converter 115; a Quadrature Modulating unit (QMOD) 116; a local oscillator 117; an amplifier 118; a directional coupler 119; a mixer (multiplier) 120; a local oscillator 121; an analogue/digital (A/D) converter 122; a 1/M clock (CLK)-unit delay circuit 123; a clock (CLK)-unit delay circuit 124; and a subtracter 125; an FFT arithmetic operator 126; an integrator 127; a bus 128; and a CPU 129.

In the DPD amplifier with such a construction, a complex signal X(I, Q), composed of an I signal and a Q signal, is input as an input signal (digital signal). The multiplier 113 multiplies the complex signal X(I, Q) by a distortion compensation coefficient given by the distortion compensation table 110, thereby performing distortion compensation, and the complex signal X(I, Q) is input to the equalizer filter 114. In this instance, the above complex signal X(I, Q) is also input to the address generator 111, which generates an index address for distortion compensation table 110, and the clock (CLK)-unit delay circuit 124, as a reference signal.

The equalizer filter 114 controls its internal parameter (filter coefficient) to perform inverse characteristic filtering of the frequency characteristic of the input signal X(I, Q) as schematically shown in FIG. 8, so that the phases of the reference signal X(I, Q) and a feedback signal Y(I, Q) of an output of the amplifier 118, which are input to the LMS arithmetic operator 112, do not have frequency components. As a result, a linear inclination frequency characteristic of an analogue circuit is compensated for. In this instance, in FIG. 8, the input signal X(I, Q) is a multicarrier signal including four carriers of C1, C2, C3, and C4. FIG. 8 shows that the above-described filtering is capable of compensating for the frequency deviation of the power values of the carriers C1 through C4.

With this arrangement, the phase relationship of each carrier signal component (C1, C2, C3, and C4) on the frequency axis between the reference signal X(I, Q) and the feedback signal Y(I, Q) becomes constant, the DPD operation ability being thereby improved. In this instance, although FIG. 7 does not illustrate it, the equalizer filter 114 is connected to the CPU 129 via the bus 128, and the above-mentioned filter coefficient is controlled by the CPU 129.

The signal, whose frequency characteristic is compensated for by the equalizer filter 114 as described above, is converted into an analogue signal by the D/A converter 115, and is then modulated (quadrature modulation) by the quadrature modulating unit 116 based on an output of the local oscillator 117, and is input to the amplifier 118 as a signal in a radio frequency (RF) band. The input signal is amplified by the amplifier 118 up to a required power value (transmission power value), and is then output.

A part of the output signal is split by the directional coupler 119, and is fedback to the mixer 120, which multiplies the split signal by an output of the local oscillator 121, thereby demodulating (quadrature detection) the signal. The demodulated signal is output as a signal in an IF band, and is then converted into a digital signal (complex signal) Y(I, Q) by the A/D converter 122. After that, the signal is input to the 1/M clock (CLK)-unit delay circuit 123, the FFT arithmetic operator 126, and the integrator 127.

As schematically shown in FIG. 9, for example, the 1/M clock-unit delay circuit (digital filter) 123 delays the feedback signal Y(I, Q) so that the above feedback signal Y(I, Q) and the reference signal X(I, Q) are input to the subtractor 125 at the same timing. For this purpose, the 1/M clock-unit delay circuit 123 is capable of delaying the feedback signal Y(I, Q) with an accuracy of 1/M clock, by controlling its internal parameter [a filter (tap) coefficient of a delay filter tap from 0 to (M−1): M is an arbitrary number]. The 1/M clock-unit delay circuit 123 delays the feedback signal Y(I, Q) by a desired time Δt in 1/M units, and inputs the delayed signal Y to the subtracter 125. The reference signal X(I, Q) is delayed by the clock-unit delay circuit 124 in clock units, and is then input to the subtractor 125.

That is, to realize comparison of signals of the same time by the subtracter 125, these delay circuits 123 and 124 separately delay the reference signal X(I(t−n), Q(t−n)) and the feedback signal Y(I(t−Δt), Q(t−Δt)), which are deviated in a time relationship, to make the two signals match on the time axis with good accuracy. At that time, the delay amount Δt (fine adjustment), which is smaller than a clock frequency, is delayed by the digital filter 123. In this instance, this digital filter 123 is also connected to the CPU 129 via the bus 128, and the CPU 129 controls the internal parameter (filter coefficient) of the digital filter 123, thereby controlling a delay amount.

Then, the subtracter 125 performs subtraction processing on the signals X (I, Q) and Y (I, Q) of the same time, whose input timings are matched due to the above delay adjustment, thereby detecting an error signal. On the basis of the error signal, the distortion compensation arithmetic operator 112 updates distortion compensation coefficients in the distortion compensation table 110 using, for example, the LMS algorithm.

As described above, the DPD amplifier adaptively updates a distortion compensation coefficient used in distortion compensation (multiplier 113) of the input signal X (I, Q) based on a difference (error) between the reference signal X(I, Q) and the feedback signal Y(I, Q), and compensates for nonlinear distortion of the amplifier 118, thereby improving the amplification efficiency.

Here, internal parameters (filter coefficients) of the equalizer filter 114 and the digital filter 123 are adaptively corrected by the CPU 129. That is, the FFT arithmetic operator 126 performs FFT processing on the feedback signal Y(I, Q), thereby performing frequency analysis. From the result (FFT result data), the CPU 129 obtains data equivalent to ACLR (Adjacent Channel Leakage Ratio) 5 MHz carrier separation under the 3GPP standards.

For example, in a case where data (data of frequency vs. power value) shown in FIG. 11 is obtained as the FFT result data, the CPU 129 obtains data of measurement points (monitoring range) indicated by the frames 100 whose center frequency is apart from the center frequency of the power value obtaining points indicated by the frames 200 by 5 MHz in the central direction. In this instance, in FIG. 11, the power value obtaining points 200 indicate ranges of power values obtained by an integration operation by the integrator 127; C1, C2, C3, and C4 designate carrier signal components already described.

As schematically shown in FIG. 10, of the data obtained at the above-mentioned measurement points 100, the CPU 129 compares high-frequency data with low-frequency data, and regards the worse data (data with a greater distortion deterioration amount within the monitoring range) as distortion data. The CPU 129 obtains the distortion data while changing the above-mentioned parameters, and corrects the parameters so that the distortion data is improved. Here, with the construction shown in FIG. 7, the distortion amount is not only changed by changing the parameters, and the distortion amount difference becomes definite by updating distortion compensation coefficients in the distortion compensation table 110.

In this instance, the integrator 127 integrates the feedback signal Y(I, Q), and notifies the CPU 129 of the power value (the power value obtained at the power value obtaining points 200 in FIG. 11) via the bus 128, thereby making it possible for the CPU 129 to detect abnormal transmission power and to output an alarm.

The following patent documents 1 and 2 propose other previous examples of the above DPD technology.

The art disclosed in patent document 1 relates to a distortion compensation apparatus. The apparatus halts updating of the distortion compensation table when the signal level of the reference signal X(I, Q) or of the feedback signal Y(I, Q) changes to "0" or when those signals contain only noise components due to some reason such as apparatus failure. This is because various functions of the distortion compensation apparatus do not act correctly in such cases. With this arrangement, it is possible to ensure a correct operation of distortion compensation even when the above reference signal X(I, Q) or the feedback signal Y(I, Q) has a signal level of "0" or only noise components.

The art of patent document 2 relates to a distortion compensation system. In this art, a transmission signal and a feedback signal are compared in amplitude and phase. The distortion of an amplifier is arithmetically estimated, and the above transmission signal is subjected to predistortion processing. In the distortion compensation system, an arithmetic operation control means which generates inverse characteristics of frequency characteristics of the transmission and the feedback system is provided at a distortion compensation arithmetic operation. This arithmetic operation control means corrects frequency characteristics of the transmission and the feedback system. With this arrangement, signal deterioration depending upon the frequency characteristic of the systems can be eliminated, and it is possible to accurately perform distortion compensation processing depending upon quadrature error of a quadrature amplifier and a detector. In addition, it is also possible to reduce reception (Rx) offset and quadrature error, which causes distortion compensation deterioration, even during transmission.

[Patent Document 1] International Patent Application Publication Pamphlet No. WO 03/103166

[Patent Document 2] Japanese Patent Application Laid-open No. HEI 10-327209

In the previous arts, however, when the output power (electric power) is so low that distortion of the amplifier 118 is not generated, it is only possible to detect distortion equal to or smaller than a range within which the FFT arithmetic operator 126 is analyzable. Thus, it is impossible to detect changes in distortion value due to parameter changes so that accurate parameter correction (setting) is unavailable. Further, an error component (see reference character 300 in FIG. 11) at the above measurement point 100 of the FFT result data causes error in the distortion value obtaining result. As a result, parameter values can deviate from the optimum parameter value every time parameter updating is performed. Under such a state, if output power is steeply increased resulting from change in the number of carriers, for example, large distortion can be caused suddenly.

SUMMARY OF THE INVENTION

With the foregoing problems in view, it is an object of the present invention to make it possible to accurately set a parameter relating to detection of a difference which is a factor of updating distortion compensation coefficients in an equalizer filter and a delay circuit (digital filter) or the like of a distortion compensation apparatus.

In order to accomplish the above object, according to the present invention, there is provided a distortion compensating apparatus which compensates for nonlinearity of an amplifier by adaptively updating a distortion compensation coefficient for an input signal input to the amplifier based on a difference between an input signal and an output signal of the amplifier, the apparatus comprising: distortion amount detecting means which detects the amount of distortion of an output signal of the amplifier; parameter holding means which holds a parameter having been set therein, the parameter holding means being capable of varying the difference according to the parameter set therein; parameter correcting means which corrects the parameter held in the parameter holding means in such a manner that the distortion amount detected by the distortion amount detecting means is improved; and distortion amount correcting means which corrects the distortion amount detected by the distortion amount detecting means in such a manner that the distortion amount is reduced by an offset amount according to an detection error.

As a preferred feature, the parameter holding means comprises an equalizer which compensates for the frequency characteristic of an input signal input to the amplifier according to the parameter set therein.

As another preferred feature, the parameter holding means comprises a timing adjusting unit which adjusts comparison timing, at which the input and output signals are compared, for detecting the difference according to the parameter set therein.

As yet another preferred feature, the distortion compensating apparatus further comprises means which realizes the optimal offset amount in accordance with the current transmission state, by adaptively updating the offset amount.

As a generic feature, there is provided a distortion compensating method for compensating for nonlinearity of an amplifier by adaptively updating a distortion compensation coefficient for an input signal input to the amplifier based on a difference between an input signal and an output signal of the amplifier, the method comprising: (a) detecting the amount of distortion of an output signal of the amplifier; (b)

correcting a parameter held in parameter holding means, which is capable of varying the difference according to the parameter set therein, in such a manner that the distortion amount detected in the step (a) is improved; and (c) correcting the distortion amount detected in the step (a) in such a manner that the distortion amount is reduced by an offset amount according to an detection error.

According to the above described present invention, an offset value equivalent to an error component is subtracted from distortion reference data. This makes it possible to reliably prevent erroneous setting such that a parameter becomes apart from the optimum value due to the influence of a distortion measurement error.

Other objects and further features of the present invention will be apparent from the following detailed description when read in conjunction with the accompanying drawings.

DESCRIPTION OF THE PREFERRED EMBODIMENT(S)

[A] First Embodiment

Figure 1:
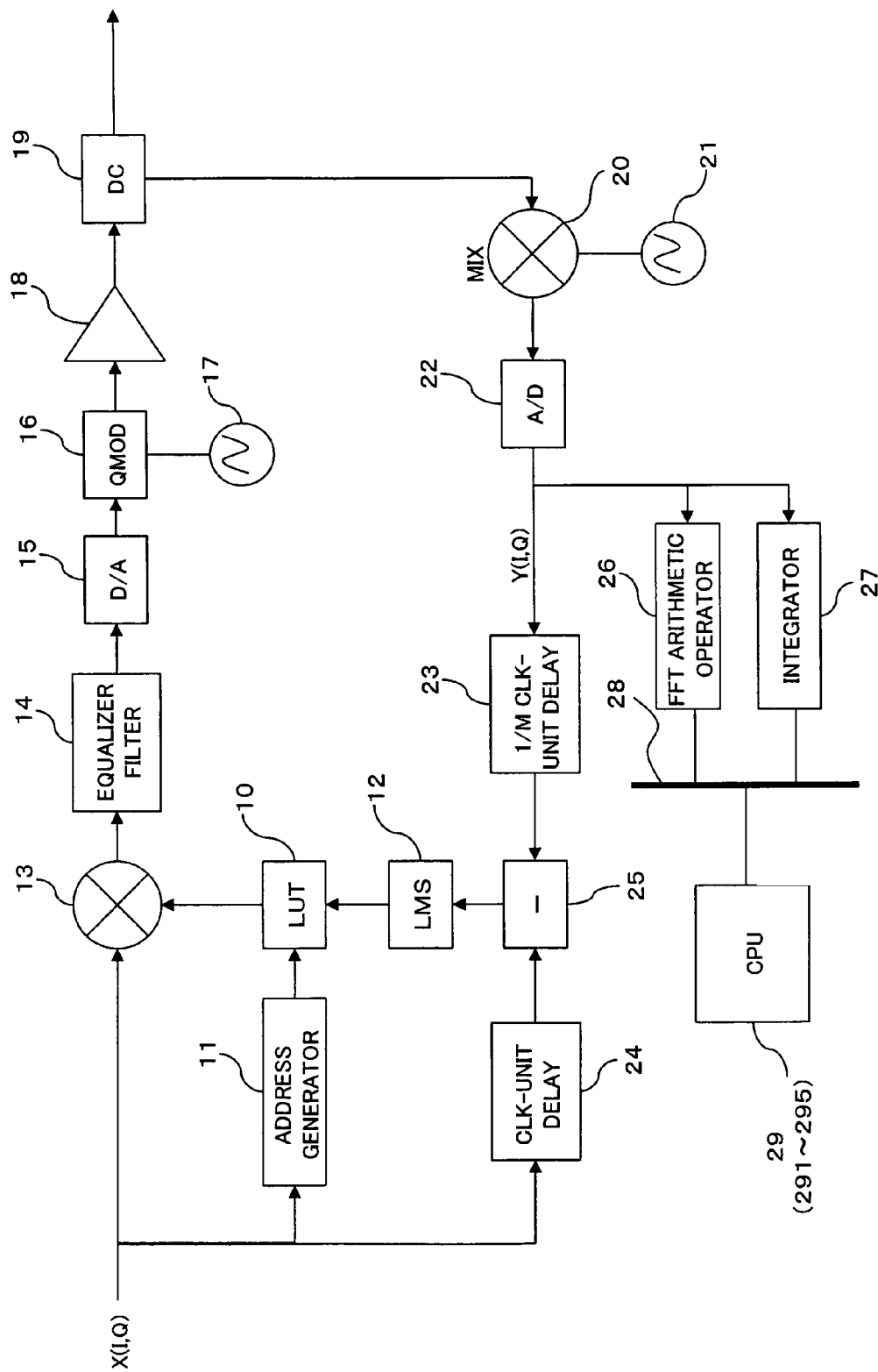
FIG. 1 is a block diagram showing a construction of an important part of a Digital Predistortion (DPD) amplifier (distortion compensating apparatus) according to a first embodiment of the present invention.

FIG. 1 is a block diagram showing a construction of an important part of a digital predistortion amplifier (distortion compensating apparatus) according to a first embodiment of the present invention. The DPD amplifier of FIG. 1 also includes: a Lookup Table (LUT: distortion compensation table) 10; an address generator 11; an LMS arithmetic operator (distortion compensation arithmetic operation unit) 12; a multiplier 13; an equalizer filter (complex filter) 14; a digital/analogue (D/A) converter 15; a quadrature modulation unit (QMOD) 16; a local oscillator 17; an amplifier 18; a directional coupler 19; a mixer (multiplier) 20; a local oscillator 21; an analogue/digital (A/D) converter 22; a 1/M-clock (CLK) unit delay circuit 23; a clock (CLK)-unit delay circuit 24; a subtractor 25; an FFT arithmetic operator 26; an integrator 27; a bus 28; and a CPU 29. In this instance, the DPD amplifier is applicable to, for example, a transmitter system of a base station apparatus. Further, it is assumed that an input signal (that is, transmission signal) is a multi-carrier signal.

Here, the distortion compensation table 10 stores distortion compensation coefficients, which are for compensating for distortion beforehand that can be caused when an input signal (complex signal) X(I, Q) (hereinafter also simply called X), a digital signal, is amplified by the amplifier 18. The coefficients are stored separately, for example, for power values of the input signal X. A distortion compensation coefficient of an address generated and specified by the address generator 11 based on the power value of the input signal X is supplied to the multiplier 13. The distortion compensation coefficients are adaptively updated in accordance with an arithmetic operation result obtained by the distortion compensation arithmetic operator 12.

The address generator 11 receives an input signal X as a reference signal, and generates an index address for the distortion compensation table 10 according to the power value of the input signal. The distortion compensation arithmetic operator 12 adaptively updates distortion compensation coefficients in the distortion compensation table 10 based on a difference (error signal) between the reference signal X obtained by the subtracter 25 and a feedback signal (complex signal; detailed below) Y(I, Q)(hereinafter also simply called Y).

Figure 8:
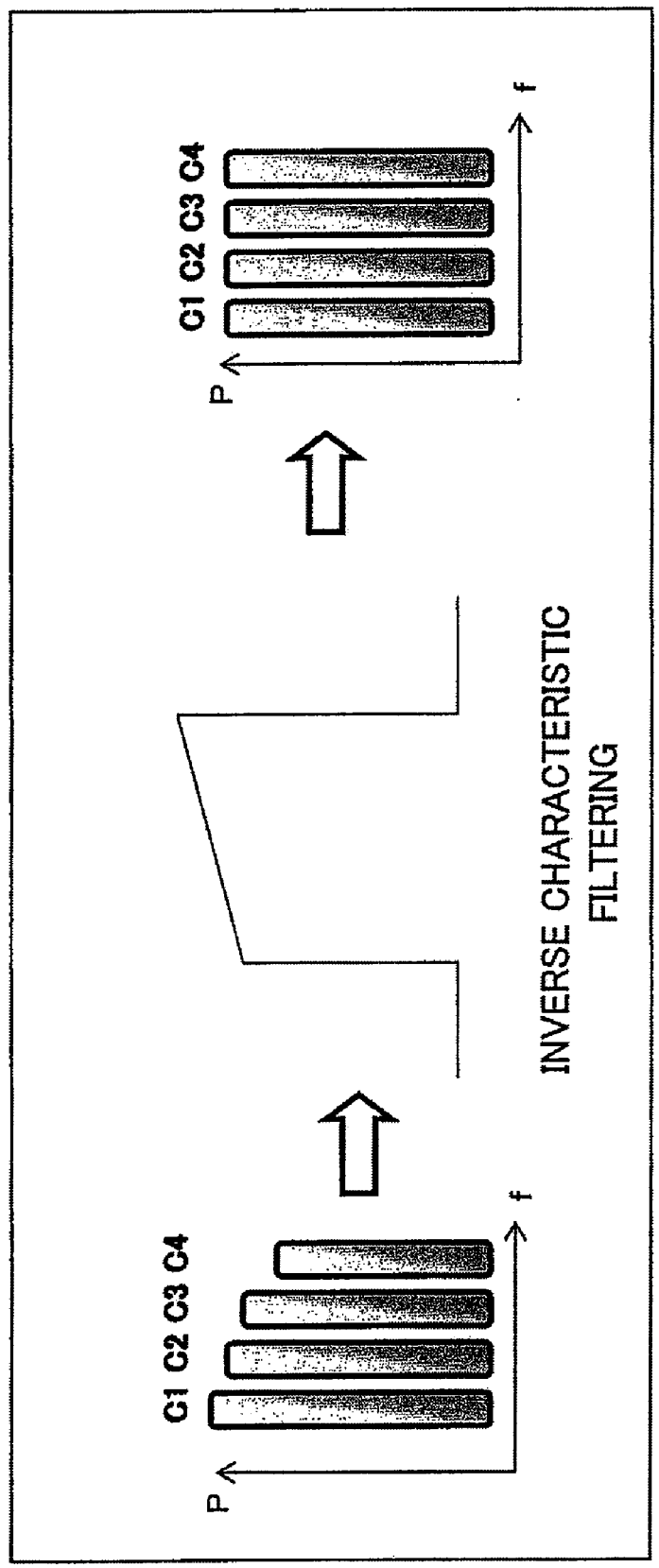
FIG. 8 is a schematic diagram for describing a function of an equalizer filter shown in FIG. 7.

The multiplier (distortion compensating unit) 13 multiplies the input signal X by a distortion compensation coefficient from the distortion compensation table 10, thereby compensating beforehand for distortion which can be caused when the input signal X is amplified by the amplifier 18. The equalizer filter (complex filter) 14 is a parameter holding means which holds a parameter set therein. The equalizer filter 14, which is formed by, for example, a digital filter, can vary a difference detected by the subtracter 25 according to the parameter [filter (tap) coefficient] set therein. As already described with reference to FIG. 8, the above-mentioned internal parameter of the equalizer filter 14 is controlled, so that the equalizer filter 14 performs inverse characteristic filtering on the frequency characteristic of the input signal X, to compensate for the linear inclination frequency characteristic of an analogue circuit (frequency deviation of each carrier signal component), thereby making the phase relationship of each carrier signal component constant.

In this instance, the equalizer filter 14 has, for example, several tens of tap coefficients, and is capable of compensating for a linear inclination characteristic of a few dB, which can occur in a signal band (for example, several tens MHz width) to be amplified. In addition, the equalizer filter 14 is connected to the CPU 29 via the bus 28 (not illustrated in FIG. 1), and the above-mentioned parameter is under control of the CPU 29.

The D/A converter 15 converts an output signal of the equalizer filter 14 into an analogue signal. The quadrature modulation unit 16 modulate (quadrature modulation) the analogue signal using a frequency signal from the local oscillator 17. The amplifier 18 amplifies the modulated signal obtained by the above modulation so that the modulated signal has a desired transmission power value.

The directional coupler 19 splits a part of an output of the amplifier 18 to feedback it to the mixer 20. The mixer 20 multiplies a feedback signal from the directional coupler 19 by a frequency signal from the local oscillator 21, thereby demodulating (quadrature detection) the feedback signal to generate a demodulation signal of an IF band. The A/D converter 22 converts the modulation signal into a digital signal, thereby obtaining a feedback signal Y(I, Q), which is a complex digital signal.

The 1/M-clock unit delay circuit 23 is a digital filter circuit (M is an arbitrary value, and delay filter taps of 0 through (M−1) are prepared) which is capable of delaying the feedback signal Y with an accuracy of 1/M clock so that the input timing of the feedback signal Y matches the input timing of the reference signal X. The 1/M-clock unit delay circuit 23 delays the feedback signal Y by a required time Δt with an accuracy of 1/M clock unit and inputs the delayed signal to the subtractor 25. The clock-unit delay circuit 24, which is formed by, for example, one or more flip-flops (FFs), delays the reference signal X in clock units and inputs the delay signal to the subtractor 25.

Figure 9:
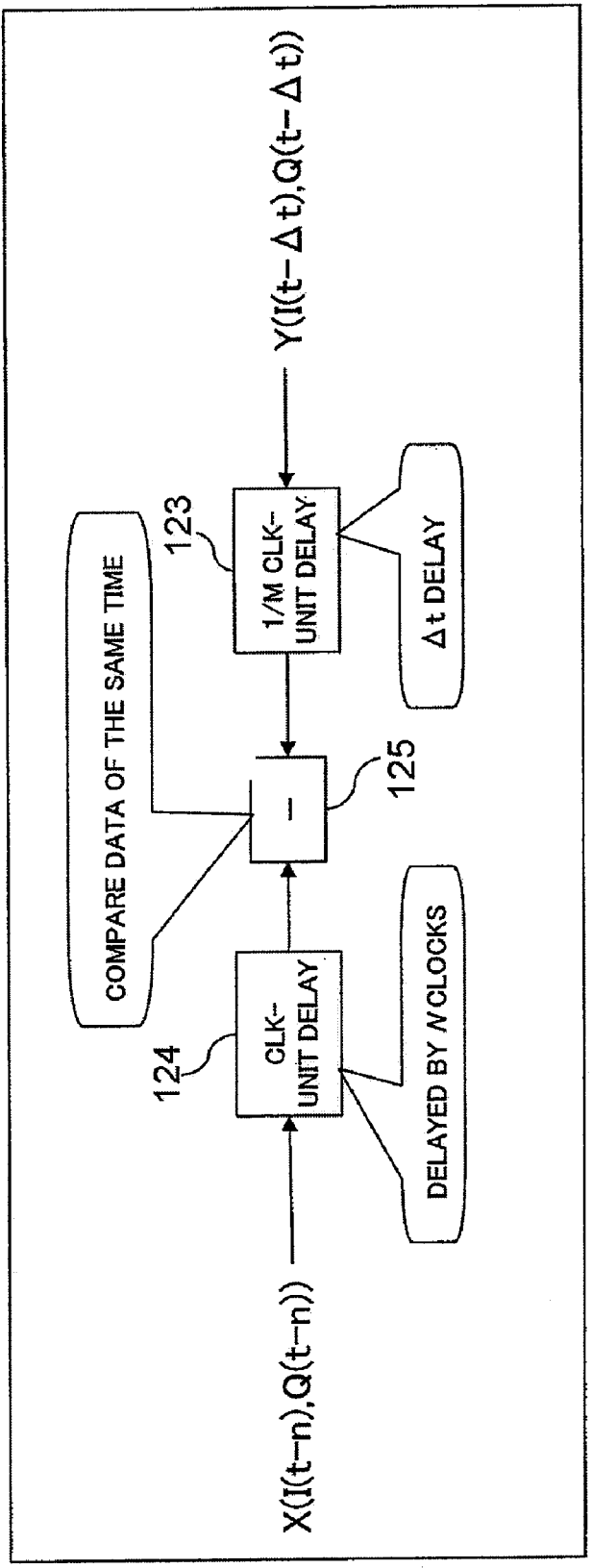
FIG. 9 is a diagram for describing a function of a delay circuit shown in FIG. 7.

That is, as already described with reference to FIG. 9, in order to realize comparison of signals of the identical time by the subtractor 25, the delay circuits 23 and 24 serve as a delay adjusting unit (a timing adjusting unit which adjusts comparison timing at the subtracter 25) which separately delays the reference signal X(I(t−n), Q(t−n)) and the feedback signal Y(I(t−Δt), Q(t−Δt), which have a time lag therebetween, to make both signals match each other with good accuracy on the time axis. At that time, a delay of Δt (fine adjustment), which is smaller than a clock frequency, is delayed by controlling an internal parameter [filter (tap) coefficient] of the 1/M-clock unit delay circuit 23.

In other words, the 1/M-clock unit delay circuit (digital filter) 23 is also a parameter holding means which is capable of varying a difference detected by the subtracter 25 according to a parameter set therein. In this instance, the digital filter 23 is also connected to the mixer CPU 29 via the bus 28, and the CPU 29 controls the internal parameter (filter coefficient) of the 1/M-clock unit delay circuit 23, thereby controlling the delay amount of the 1/M-clock unit delay circuit 23.

The subtracter (difference detecting unit) 25 performs subtraction processing on the reference signal X and the feedback signal Y of the same time, whose input timings are matched by the above-mentioned delay adjustment, thereby detecting a difference (error signal) therebetween. On the basis of the difference, the distortion compensation arithmetic operator 12 updates distortion coefficients in the distortion compensation table 10 using, for example, the LMS algorithm.

The FFT arithmetic operator 26 receives an FFT execution instruction from the CPU 29 via the bus 28 and executes FFT processing on the feedback signal Y to carry out frequency analysis. The analysis result (FFT result data; see, for example, FIG. 11) can be obtained by the CPU 29 via the bus 28. The integrator (power monitoring means) 27 integrates the feedback signal Y for a specified time period, thereby detecting (monitoring) the power value (for example, the power value at power value obtaining points 200 in FIG. 11), and the detection result can be obtained by the CPU 29 via the bus 28.

Further, the CPU 29 acquires, from the FFT result data obtained by the FFT arithmetic operator 26, data corresponding to ACLR 5 MHz carrier separation under the 3GPP standard. The CPU 29 regards data whose distortion deterioration amount is large as distortion data, and obtains the distortion data while changing the above-mentioned parameter, and corrects the parameter so that distortion data is improved.

That is, the CPU 29 of the present example realizes (i) a function as a distortion amount detecting means 291 which detects the distortion amount of an output signal of the amplifier 18 and (ii) a function as a parameter correcting means 292 which corrects parameters of the equalizer filter 14 and the 1/M-clock unit delay circuit 23 so that the distortion amount thus detected is improved.

Figure 10:
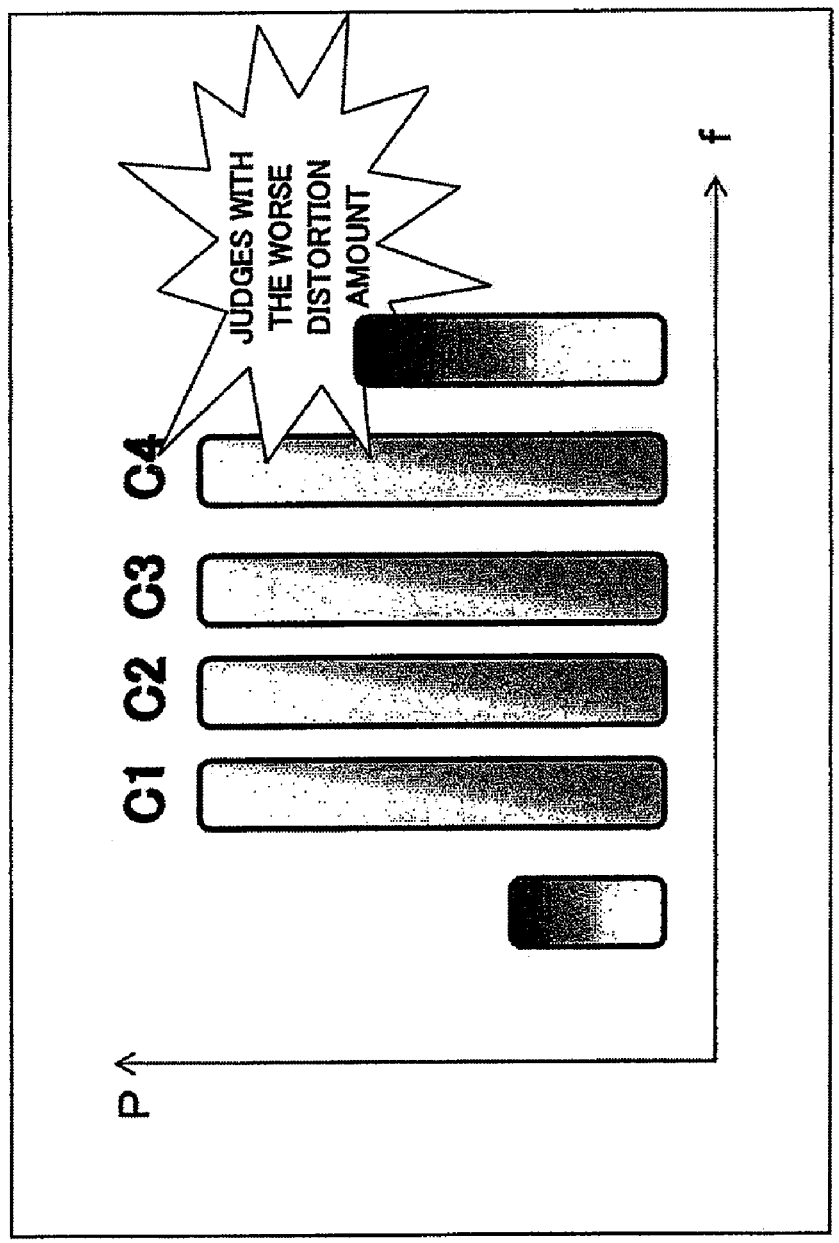
FIG. 10 is a schematic diagram for describing acquisition of distortion data by a CPU shown in FIG. 7.
Figure 11:
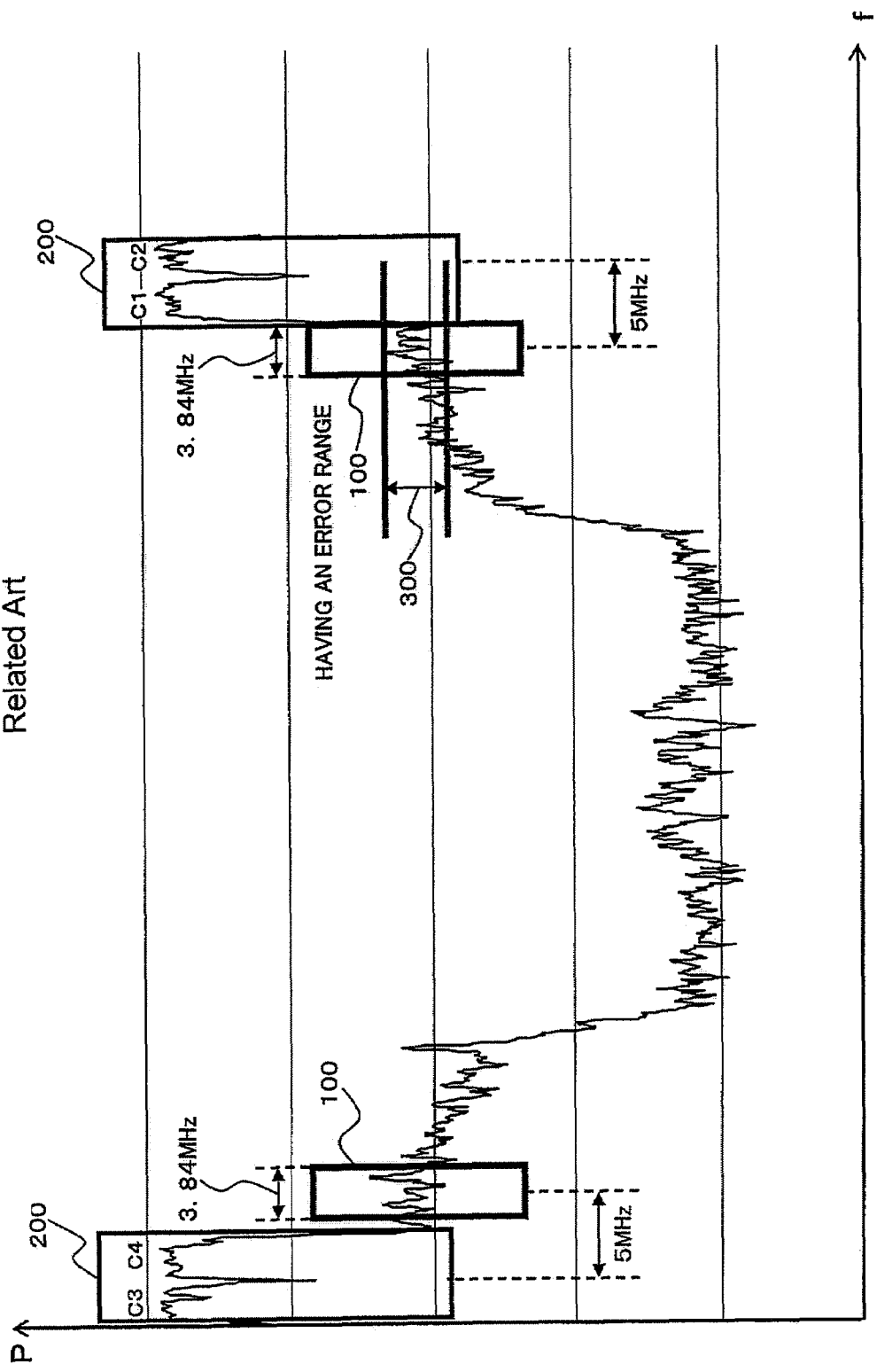
FIG. 11 is a diagram showing an example of an arithmetic operation result (FFT result data) obtained by an FFT arithmetic operator shown in FIG. 7.

More specifically, as shown in FIG. 11, the CPU 29 obtains data of measurement points (monitoring range) indicated by the frames 100, whose center frequency is 5 MHz apart in the central direction from the center frequency of the power value obtaining points indicated by the frames 200. The obtained data higher in frequency is compared with the obtained data lower in frequency. As already described with reference to FIG. 10, the worse data (data within the monitoring range with the greater distortion deterioration amount) is recognized as distortion data, and the CPU 29 obtains the distortion data while changing the above-mentioned parameters, and corrects the distortion data so that the distortion data is improved. Here, in the present embodiment, also, the distortion amount is not significantly changed only by changing the parameters, and the difference of the distortion amount becomes definite by updating the distortion compensation coefficients in the distortion compensation table 10.

Further, the CPU 29 of the present embodiment also executes the following functions:

(1) a judging function 293 of acquiring the power value obtained by the integrator 27 and evaluating whether or not the power value is greater than a specified threshold value inclusive;

(2) a parameter correction controlling function 294 of (i) correcting the above parameters as usual when the above judgment reveals a positive result, (ii) halting the parameter correction when the above judgment reveals a negative result;

(3) a distortion data (distortion amount) correcting function 295 of correcting (offset subtraction) the distortion data (distortion reference data) obtained at the above-mentioned measurement point 100 so that the distortion data becomes smaller by the offset amount according to an error component (measurement error).

In this instance, the threshold value of the above-mentioned power value (transmission power value) is set mainly according to the analysis ability of the FFT arithmetic operator 26, and is stored in a memory or the like to which the CPU 29 is appropriately accessible.

That is, the DPD amplifier (distortion compensating apparatus) of the present embodiment halts the parameter correction when the transmission power value is smaller than a specified power value, which reveals a state where only distortion which is smaller than a range which can be analyzed by the FFT arithmetic operator 26 occurs. In addition, the DPD amplifier of the present embodiment corrects the distortion reference data obtained by the FFT processing according to its error component, thereby making it possible to prevent setting of abnormal parameter values due to a measurement error of the distortion value.

Now, an operation of the distortion compensating apparatus with the above-described construction of the present embodiment will be detailed hereinbelow.

(A1) Basic Operation of the Whole Apparatus:

First of all, the multiplier 13 multiplies an input signal X by a distortion compensation coefficient provided by the address generating table 10, thereby compensating for distortion thereof. After distortion compensation, the input signal X is input to the equalizer filter 14. As already described, an internal parameter (filter coefficient) of the equalizer filter 14 is controlled by the CPU 29, and the equalizer filter 14 performs filtering with an inverse characteristic of the frequency characteristic of the input signal X, thereby compensating for a linear inclination frequency characteristic of an analogue circuit.

The signal after the above compensation performed thereon is converted into an analogue signal by the D/A converter 15, and is modulated (quadrature modulation) by the quadrature modulation unit 16 based on an output of the local oscillator 17, and is then input to the amplifier 18 as a signal in a radio frequency (RF) band. After that, the signal is amplified by the amplifier 18 up to a desired power value (transmission power value) before being output.

A part of the output signal is split by the directional coupler 19 and is fedback to the mixer 20, which multiplies the split signal by an output of the local oscillator 21, thereby demodulating (quadrature detection) the signal. The demodulated signal is output as a signal in an IF band, and is converted by the A/D converter 22 into a digital signal (complex signal) Y, and is then input into the 1/M-clock unit delay circuit 23, and the FFT arithmetic operator 26, and the integrator 27.

The 1/M-clock unit delay circuit (digital filter) 23 delays the feedback signal Y by a desired time $\Delta t$ in 1/M clock units so that input timings of the feedback signal Y and the reference signal X to the subtractor 25 match each other. The reference signal X is delayed by the clock-unit delay circuit 24 in clock units, and is then input to the subtractor 25.

The subtractor 25 performs subtraction processing on the reference signal X and the feedback signal Y of the same time, whose input timings are matched by the above-mentioned delay adjustment, thereby detecting an error signal. On the basis of the error signal, the distortion compensation arithmetic operator 12 updates distortion coefficients in the distortion compensation table 10 using, for example, the LMS algorithm.

As described so far, according to the DPD amplifier of the present embodiment, also, on the basis of the difference (error) between the reference signal X and the feedback signal Y, a coefficient used in distortion compensation (multiplier 13) of the input signal X is adaptively updated, whereby nonlinear distortion of the amplifier 18 is compensated for, so that amplification efficiency is improved.

(A2) Operation of CPU 29 (part 1)

Here, internal parameters (filter coefficients) of the equalizer filter 14 and the 1/M-clock unit delay circuit 23 are adaptively corrected by the CPU 29. The CPU 29 of the present example operates following the flowcharts of FIG. 2 through FIG. 4, for example.

Figure 2:
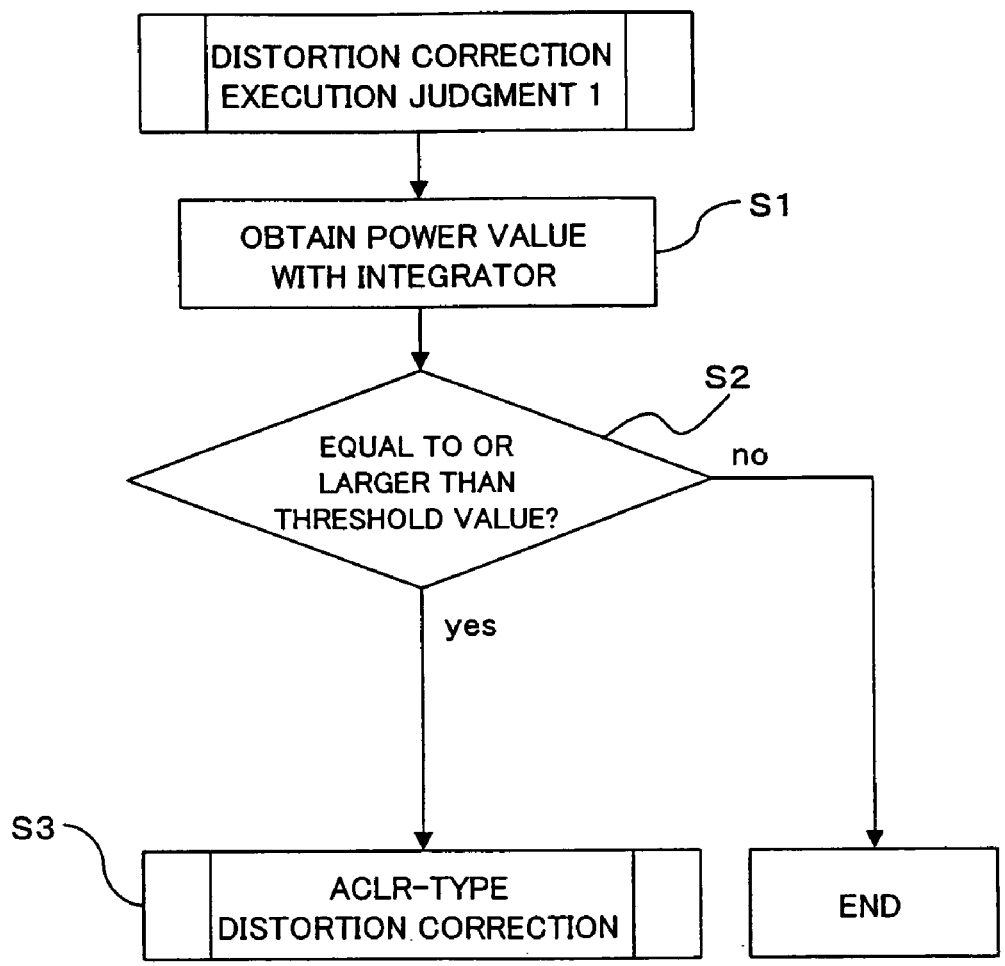
FIG. 2 is a flowchart for describing an operation (distortion correction execution judgment) of a CPU shown in FIG. 1.
Figure 3:
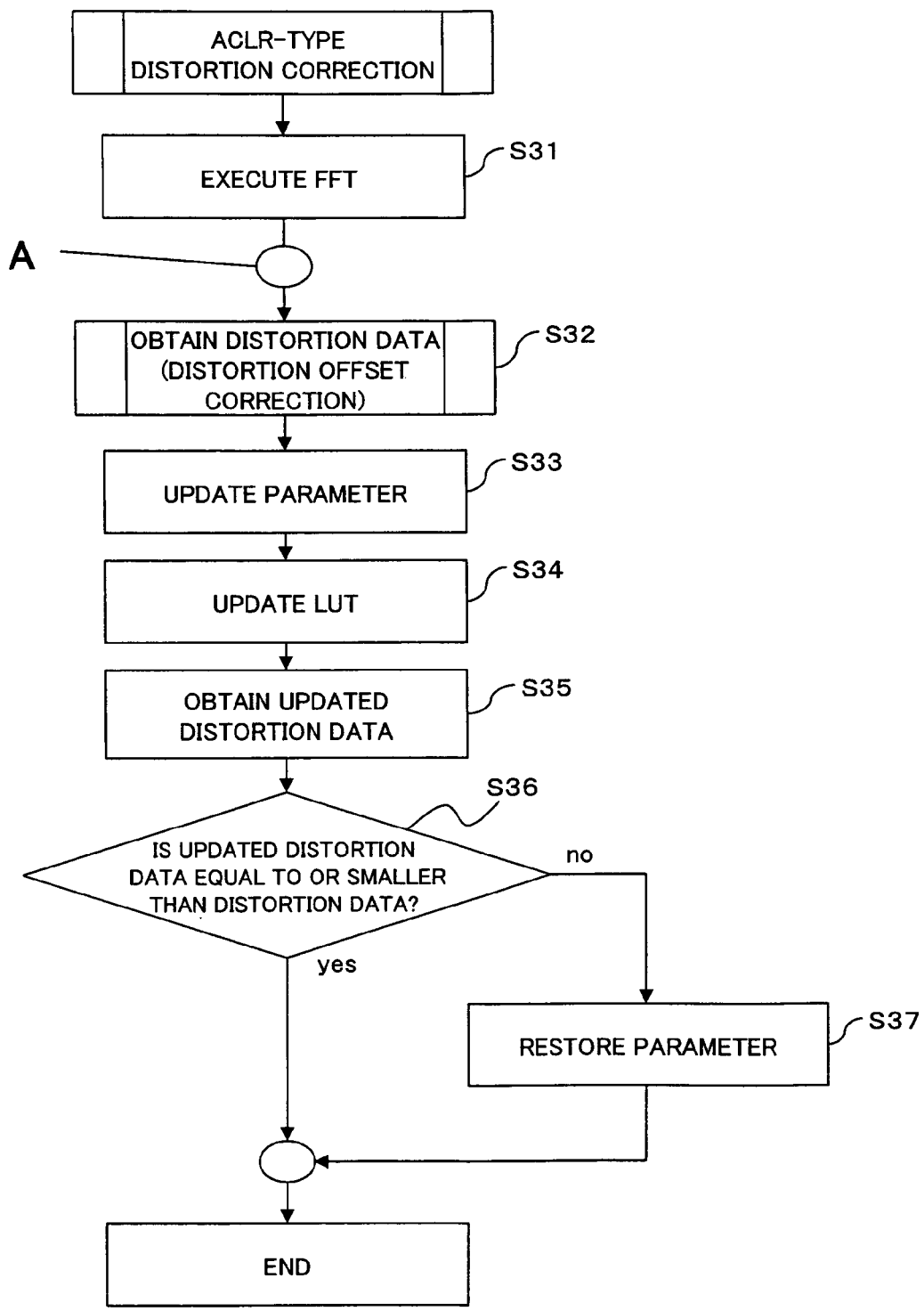
FIG. 3 is a flowchart for describing an operation (ACLR-type distortion correction) of a CPU shown in FIG. 1.

That is, as shown in FIG. 2, the CPU 29 obtains, via the bus 28, an integral (power value) for a specified period (for example, 100 ms division) obtained by integration performed by the integrator 27 (step S1), and evaluates whether or not the power value is greater than a specified threshold value inclusive (power monitoring step; step S2). The greater the power value of the feedback signal Y, the greater the integral. In consequence, if the integral is greater than the threshold value inclusive, the CPU 29 executes normal ACLR-type distortion correction processing as shown in FIG. 3.

That is, the CPU 29 gives an FFT execution instruction to the FFT arithmetic operator 26 via the bus 28, thereby activating the FFT arithmetic operator 26, and makes the FFT arithmetic operator 26 execute FFT processing on the feedback signal Y. The CPU 29 obtains the result (FFT result data) of the FFT processing, and then obtains distortion data, as described above, from the FFT result data (distortion amount detecting step; steps S31 and S32).

Figure 4:
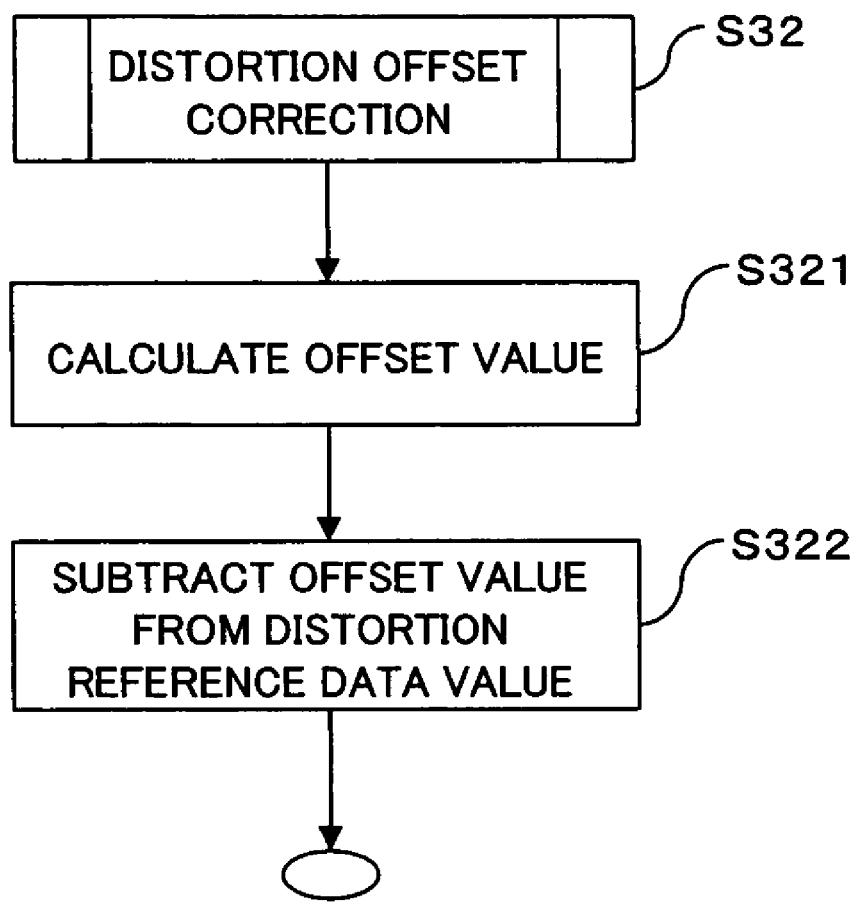
FIG. 4 is a flowchart for describing an operation (distortion offset correction) of a CPU shown in FIG. 1.

Then, the CPU 29 performs distortion offset correction processing, using the obtained distortion data as reference distortion data (step S32). More specifically, as shown in FIG. 4, for example, the CPU 29 calculates an offset value (step S321). The CPU 29 then subtracts the offset value from the above-mentioned distortion reference data (also called a distortion reference value) to perform correction (so that the distortion reference data becomes smaller) (distortion amount correction step; step S322).

Here, as concrete examples of the offset value calculating methods, there are the following methods (a) through (c).

(a) Offset value calculation by error learning:

The FFT arithmetic operator 26 is activated at times other than ACLR-type correction execution times, to execute FFT arithmetic operations. Measurement error is obtained based on the result data obtained as a result of FFT arithmetic operations performed several to several tens of times. The thus obtained measurement error is used as an offset value.

(b) Offset value calculation with a linear equation:

As shown in the following equation (1), an offset value corresponding to the power value (integral) measured by the integrator 27 is calculated. When a fixed offset value is used, the offset value appears to be relatively large when the power value is small. Correction performed on the measured power value makes the power value ratio of the error component value to the power value constant.

$$\text{Offset amount}=\text{power integral}\times\alpha+\beta \quad (1)$$

(c) Offset value calculation by bit width limitation:

The Effective bit width is determined beforehand, and other values are decided to be error values. After bit conversion of the distortion reference value, a fixed value (for example, 1) is subtracted from the lowermost bit, whereby an offset value with a constant power value ratio is obtained. For example, assuming that the distortion reference value is 3FFF (hex) and the effective bit width is 7, 3F00 (hex) is obtained. Further, "1" is subtracted from the lowermost bit, 3E00 (hex) is obtained, which is the distortion reference value after offset correction is performed.

That is, in cases of the above (b) and (c), the offset amount is a variable amount (the power value ratio is constant) which is in accordance with the power monitoring result.

The above offset value calculation methods (a) through (c) are adaptively executed to update the offset value, thereby making it possible to obtain the optimal offset value under the current transmission state.

Figure 5:
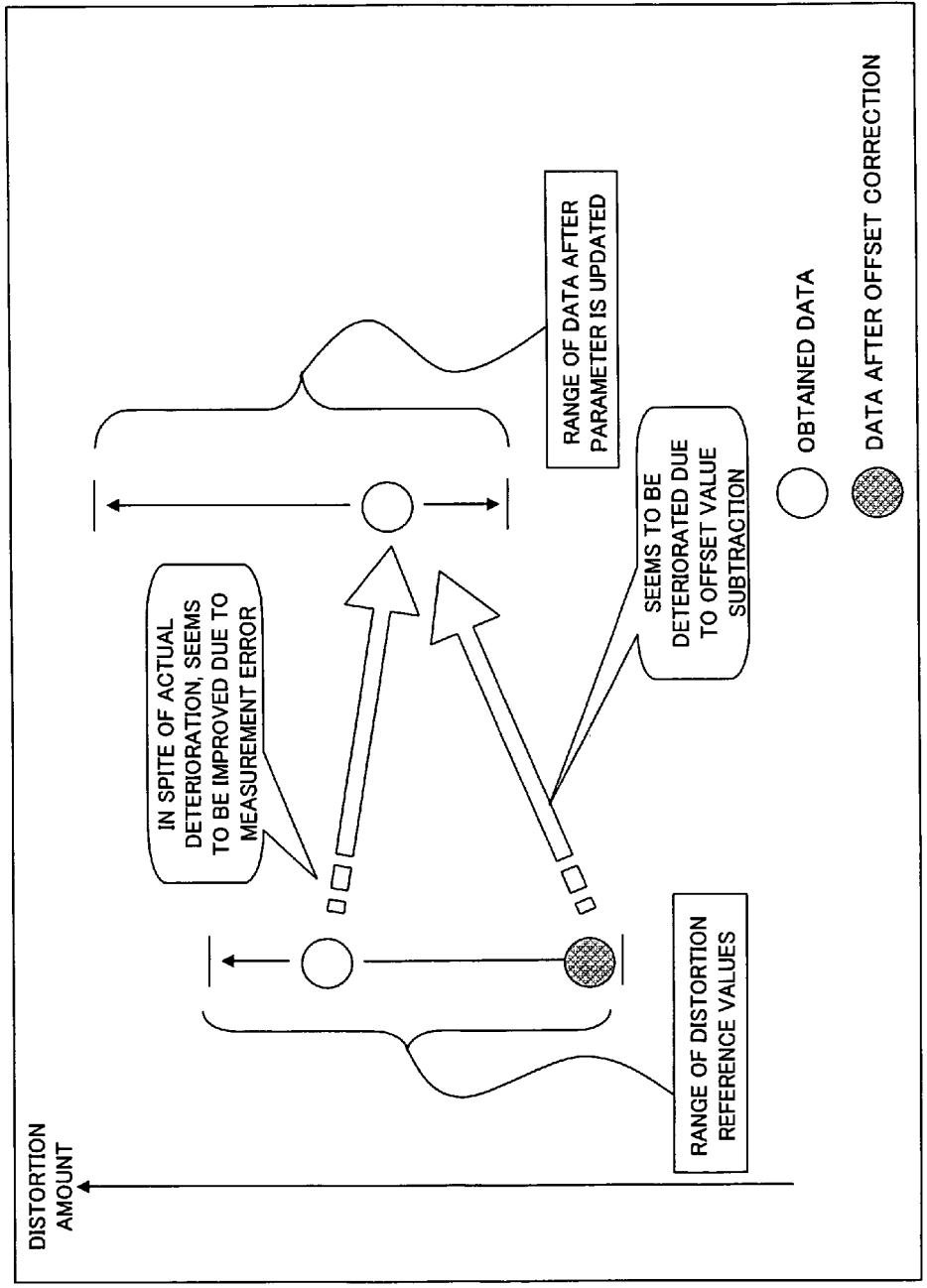
FIG. 5 is a schematic diagram for describing effects of the distortion offset correction shown in FIG. 4.

As a result of the distortion reference data correction (offset subtraction) as described above, as schematically shown in FIG. 5, for example, it is possible to prevent the occurrence of phenomenon where distortion, which is actually deteriorated, seems to be improved due to the distortion reference data appearing to be smaller than the actually obtained data because of a measurement error. Thus, it is possible to reliably prevent abnormal setting of each parameter caused by the influence of the measurement error. In this instance, even when the distortion reference value before offset correction is a significantly low value, as shown in FIG. 5, since the range of distortion reference values after offset value subtraction has a lower limit, and the distortion reference values cannot fall below the lower limit, it is possible to prevent erroneous setting of parameters.

Here, the above-mentioned offset correction processing (steps S321 and S322 of FIG. 4) of the distortion reference data need not necessarily be performed, and it can be selectively performed.

Next, as shown in FIG. 3, the CPU 29 updates (changes) the above-mentioned parameters with a specified updating step width, etc., thereby updating distortion compensation coefficients in the distortion compensation table 10 (parameter correction step; steps S33 and S34). With the distortion coefficients having been updated, the CPU 29 obtains distortion data (updated distortion data) in a similar manner to the above (step S35).

Subsequently, the CPU 29 evaluates whether or not the above updated distortion data is equal to or smaller than the distortion data before being updated, which is obtained before updating of the distortion compensation coefficients (parameters) (step S36). If the updated distortion data exceeds the distortion data before being updated, it means that the above updating has increased (deteriorated) the distortion amount. Thus, the CPU 29 restores the parameters before being updated (from no route of step S36 to step S37). In contrast, if the above updated distortion data is equal to or smaller than the distortion data before being updated, it means that the distortion amount is improved or maintained. The CPU 29 thus maintains the parameter value after being updated, and ends the processing (yes route of step S36). The CPU 29 activates and executes the above ACLR-type distortion correction processing at specified intervals.

On the other hand, if the power value obtained by the integrator 27 is smaller than the above-mentioned threshold value, the CPU 29 ends processing without activating the above processing (FFT arithmetic operator 26) even at a timing at which the ACLR-type distortion compensation processing is to be activated (no route of step S2 of FIG. 2). With this arrangement, the above parameter correction is halted (parameter correction controlling step), and it becomes possible to prevent setting of an abnormal parameter value resulting from the distortion data measurement error under a state where the parameter correction is halted (parameter correction controlling step), and where the transmission power value is smaller than the specified power value, and where only distortion which is smaller than a range which can be analyzed by the FFT arithmetic operator 26 occurs.

(A3) Operation of CPU 29 (part 2)

Even with a construction including no integrator 27, the CPU 29 integrates the FFT result data obtained by the FFT arithmetic operator 26, thereby realizing judgment equivalent to the threshold judgment already described with reference to FIG. 2.

Figure 6:
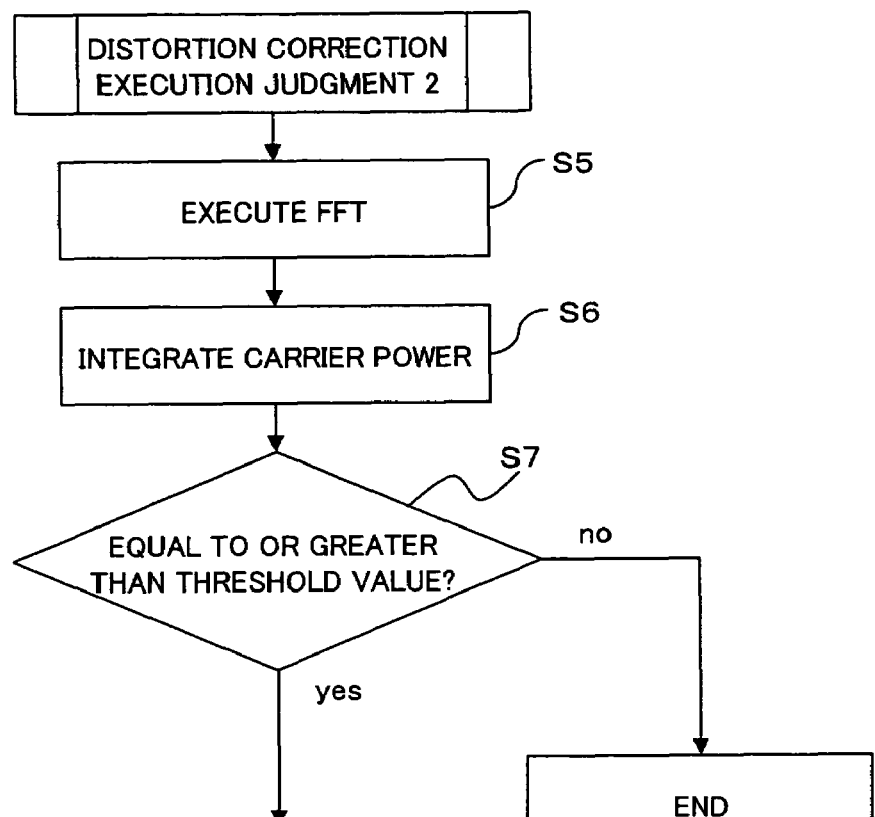
FIG. 6 is a flowchart for describing an operation (a modified example of distortion correction execution judgment) of a CPU shown in FIG. 1.
Figure 7:
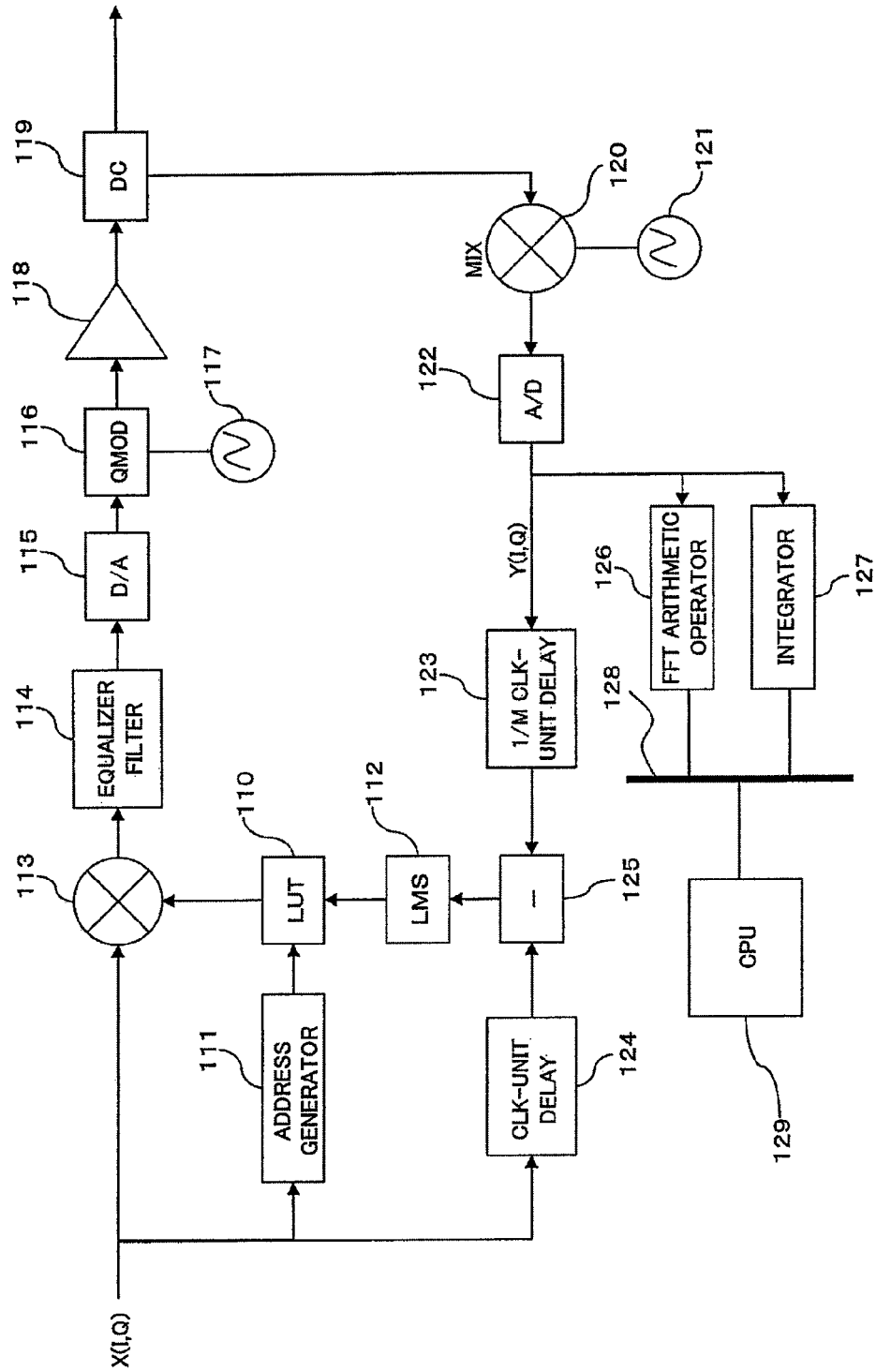
FIG. 7 is a block diagram showing a construction of an important part of a previous Digital Predistortion (DPD) amplifier.

That is, as shown in FIG. 6, the CPU 29 activates the FFT arithmetic operator 26 to make it execute FFT processing on the feedback signal Y (step S5), and obtains the result of the processing (FFT result data), and integrates data of, for example, a range (containing carrier signal components C1, C2, C3, and C4) of the power value obtaining points 200 of FIG. 11, thereby obtaining a power value (step S6).

Then, the CPU 29 compares the thus obtained power value and the above-mentioned threshold to evaluate whether or not the obtained power value is greater than the threshold value inclusive (step S7). If the evaluation result is positive, the CPU 29 executes the procedure of step S32 of FIG. 3 and the procedures thereafter, thereby executing ACLR-type distortion correction processing (yes route of step S7). If the evaluation result is negative, the CPU 29 does not execute the processing of the step S32 and thereafter, and ends the processing (no route of step S7).

As described so far, according to the present invention, the transmission power value is obtained before change of a parameter (distortion compensation coefficient). If the transmission power value is so low that distortion is not generated, a parameter correction operation is halted or an offset value corresponding to an error component is subtracted from distortion reference data, whereby it becomes possible to prevent setting of an abnormal parameter due to influence of measurement error.

Further, the present invention should by no means be limited to the above-illustrated embodiment, and various changes or modifications may be suggested without departing from the gist of the invention.

For example, in the above example, parameter correction is halted under transmission power monitoring, and distortion data offset correction processing is also performed. However, only either of the above can be performed to prevent setting of an abnormal parameter due to the influence of a measurement error.

Further, the above parameter correction halting processing is performed by directly monitoring the transmission power value. However, a factor of variation in the transmission power value, such as the number of transmission carriers, can be monitored. In this case, when the number of carriers is equal to or greater than a threshold value, parameter correction should be halted.

As detailed so far, according to the present invention, it is possible to prevent setting of an abnormal parameter due to the influence of a distortion measurement error in a distortion compensating apparatus which compensates for nonlinearity of an amplifier. Thus, the present art is significantly useful in the field of communication technology employing an amplifier, such as the field of mobile communication technology.

What is claimed is:

1. A distortion compensating apparatus which compensates for nonlinearity of an amplifier by adaptively updating a distortion compensation coefficient for an input signal input to the amplifier based on a difference between an input signal and an output signal of the amplifier, said apparatus comprising:

distortion amount detecting means which detects the amount of distortion of an output signal of the amplifier;

parameter holding means which holds a parameter having been set therein, said parameter holding means being capable of varying the difference according to the parameter set therein;

parameter correcting means which corrects the parameter held in said parameter holding means, regarding the distortion amount detected by said distortion amount detecting means as a reference, in such a manner that the distortion amount is improved; and distortion amount correcting means which corrects the distortion amount detected by said distortion amount detecting means in such a manner that the distortion amount regarded as the reference is reduced by an offset amount according to a detection error.

2. A distortion compensating apparatus as set forth in claim 1, wherein said parameter holding means comprises an equalizer which compensates for the frequency characteristic of an input signal input to the amplifier according to the parameter set therein.

3. A distortion compensating apparatus as set forth in claim 1, wherein said parameter holding means comprises a timing adjusting unit which adjusts comparison timing, at which the input and output signals are compared, for detecting the difference according to the parameter set therein.

4. A distortion compensating apparatus as set forth in claim 3, wherein the offset amount is obtained based on the distortion amounts obtained a multiple number of times by said distortion amount detecting means.

5. A distortion compensating apparatus as set forth in claim 3, wherein the offset amount is a variable amount in accordance with the monitoring result obtained by power monitoring means which monitors the power value of the output signal of the amplifier or a factor of variation in the power value.

6. A distortion compensating apparatus as set forth in claim 3, wherein the offset amount is a variable amount in accordance with the distortion amount detected by said distortion amount detecting means.

7. A distortion compensating apparatus as set forth in claim 3, further comprising means which realizes the optimal offset amount in accordance with the current transmission state, by adaptively updating the offset amount.

8. A distortion compensating apparatus as set forth in claim 2, wherein said parameter holding means comprises a timing adjusting unit which adjusts comparison timing, at which the input and output signals are compared, for detecting the difference according to the parameter set therein.

9. A distortion compensating apparatus as set forth in claim 8, wherein the offset amount is obtained based on the distortion amounts obtained a multiple number of times by said distortion amount detecting means.

10. A distortion compensating apparatus as set forth in claim 8, wherein the offset amount is a variable amount in accordance with the monitoring result obtained by power monitoring means which monitors the power value of the output signal of the amplifier or a factor of variation in the power value.

11. A distortion compensating apparatus as set forth in claim 8, wherein the offset amount is a variable amount in accordance with the distortion amount detected by said distortion amount detecting means.

12. A distortion compensating apparatus as set forth in claim 8, further comprising means which realizes the optimal offset amount in accordance with the current transmission state, by adaptively updating the offset amount.

13. A distortion compensating method for compensating for nonlinearity of an amplifier by adaptively updating a distortion compensation coefficient for an input signal input to the amplifier based on a difference between an input signal and an output signal of the amplifier, said method comprising:
  (a) detecting the amount of distortion of an output signal of the amplifier;
  (b) correcting a parameter held in parameter holding means, which is capable of varying the difference according to the parameter set therein, regarding the distortion amount detected in the step (a) as a reference, in such a manner that the distortion amount is improved; and
  (c) correcting the distortion amount detected in the step (a) in such a manner that the distortion amount regarded as the reference is reduced by an offset amount according to a detection error.

* * * * *